United States Patent [19]
Nagata et al.

[11] 4,041,335
[45] Aug. 9, 1977

[54] PIEZOELECTRIC CERAMIC RESONATOR WITH VIBRATION DAMPING MEANS

[75] Inventors: Takashi Nagata, Ikeda; Michio Ishibashi, Suita; Yasuo Nakajima, Osaka, all of Japan

[73] Assignee: Matsushita Electric Industrial Co., Ltd., Osaka, Japan

[21] Appl. No.: 288,977

[22] Filed: Sept. 14, 1972

Related U.S. Application Data

[63] Continuation of Ser. No. 58,781, July 28, 1970, abandoned, which is a continuation-in-part of Ser. No. 589,683, Oct. 26, 1966, abandoned.

[30] Foreign Application Priority Data

Oct. 26, 1965   Japan .................................. 40-66220

[51] Int. Cl.$^2$ .......................................... H01L 41/04
[52] U.S. Cl. ................................. 310/321; 310/326; 310/358; 310/369
[58] Field of Search ............... 310/8, 8.2, 8.3, 9.1–9.4, 310/9.5, 9.6

[56] References Cited

U.S. PATENT DOCUMENTS 3,348,078   5/1965   Nagata et al. ..................... 310/9.5

FOREIGN PATENT DOCUMENTS 414,764   8/1934   United Kingdom .................. 310/8.2

*Primary Examiner*—Mark O. Budd
*Attorney, Agent, or Firm*—Wenderoth, Lind & Ponack

[57] ABSTRACT

A damped piezoelectric ceramic resonator. The resonator is a thin flat plate of piezoelectric ceramic material which has parallel major planar surfaces and is polarized in one direction in such a way that said direction is at an angle of from 0° to 60° with respect to said major surfaces, the thickness dimension of said plate being such as to impart thereto a resonance of vibrations in a thickness-shear mode at a particularly selected frequency higher than one megacycle. Operating electrodes are applied to said major planar surfaces. Vibration damping means is attached tightly to the contour of the edge of said flat plate so as to suppress unwanted resonance vibrations in said flat plate during operating. The vibration damping means is a ring of a rubber material having a hardness from 20 to 70 on the Shore A Scale and is under a tension of 20–500 gm/cm.

4 Claims, 6 Drawing Figures

INVENTORS
TAKASHI NAGATA
MICHIO ISHIBASHI
YASUO NAKAJIMA

BY *Wenderoth, Lind & Ponack*

ATTORNEYS

INVENTORS
TAKASHI NAGATA
MICHIO ISHIBASHI
YASUO NAKAJIMA

BY Wenderoth, Lind & Ponack

ATTORNEYS

PIEZOELECTRIC CERAMIC RESONATOR WITH VIBRATION DAMPING MEANS

This application is a continuation of application Serial No. 58,781 filed July 28, 1970, now abandoned, which in turn is a continuation-in-part of application Ser. No. 589,683, filed Oct. 26, 1966 now abandoned.

This invention relates to piezoelectric ceramic resonators and more particularly to piezoelectric ceramic resonators for use in electric discriminators and electric wave filters having a high frequency band, which resistors have means for damping spurious vibrations.

A conventional television receiver usually comprises an FM sound discriminator for demodulating a frequency modulated sound signal. Various sound discriminators are known, such as a slope discriminator, a Travis discriminator, a Foster-Seley discriminator and a ratio discriminator, which are usually composed of a circuit which is a combination of electric transformers and electric capacitors.

In such FM sound discriminators, the inductance value has to be adjusted to the operating frequency by controlling the variable inductances of the transformers, because it is difficult to provide the transformers with precisely controlled inductances. In addition, such sound discriminators have a limiting value of linearity and sensitivity for the ratios of output voltages to frequencies because the inductances have a low factor Q, for example 50 to 150.

A quartz resonator as well as a piezoelectric resonator would seem to be useful as an ordinary FM discriminator element by using their resonant and anti-resonant frequency characteristics.

The quartz resonator, however, has a relatively low electromechanical coupling coefficient, about 10%, and produces a band width of a resonance and the antiresonance frequency which is not sufficient to demodulate the necessary FM sound signal. Therefore, it is impossible to use a quartz resonator in an FM sound discriminator of a television receiver set.

Piezoelectric ceramic resonators vibrating in thickness modes are preferably used in a frequency band higher than one megacycle per second because they have a size which is easily prepared in practice and the electromechanical coupling factor of the thickness mode is larger than that of the coupling factor of the contour vibration mode. As a practical matter however, the vibrations of ceramic resonators in the thickness mode are usually apt to have many unwanted resonances in a particular vibration mode.

Such unwanted resonances cause distortion of the output signal. Therefore, it is difficult to use conventional piezoelectric ceramic resonators as the FM sound discriminators in television receiver sets.

Recently, D. R. Curran et al have reported on a so called "Uni-Wafer filter" having a thin piezoelectric ceramic plate and partially limited electrodes in Proc. Nat. Elec. Conf., 7, p. 514 (1961). The Uni-Wafer type resonator has been improved with respect to unwanted resonance vibrations and the high frequency characteristics.

A Uni-Wafer resonator, however, requires a relatively large piezoelectric ceramic plate in comparison with the electrodes. This is not desirable for resonators characterized by a small size and a high efficiency of electromechanical transduction.

In the past, there have been developed many piezoelectric ceramics adapted for use as ceramic resonators. Among these, the most common ceramic is a solid solution of lead titanate-lead zirconate disclosed in U.S. Pat. No. 2,708,244. It is important for its use as an electrical circuit element that the ceramic have a high stability of frequency at various temperatures and over a long period of time. Few known ceramics satisfy these requirements entirely.

The general object of the invention is to provide novel piezoelectric ceramic resonators overcoming at least one of the problems of the prior art as outlined above.

A further object of the invention is to provide improved ceramic resonators applicable for use in electrical FM discriminators and electrical wave filters having a high frequency band.

Another object is to provide novel piezoelectric ceramic resonators characterized by complete suppression of unwanted resonances.

These objects are achieved by providing a piezoelectric ceramic resonator comprising a thin flat plate of the piezoelectric ceramic material polarized uniformly in one direction, operating electrodes applied to the planar major surfaces thereof, and vibration damping means which consists of a rubber material which is under tension extending around the outer contour of said thin flat plate. The thickness dimension of the plate is adjusted so as to impart to the resonator resonant vibrations in the thickness-shear mode at a particularly selected frequency.

For a better understanding of the present invention together with other and further objects thereof, reference is had to the following description taken in connection with the accompanying drawings, and its scope will be pointed out in the appended claims.

Figure 1:
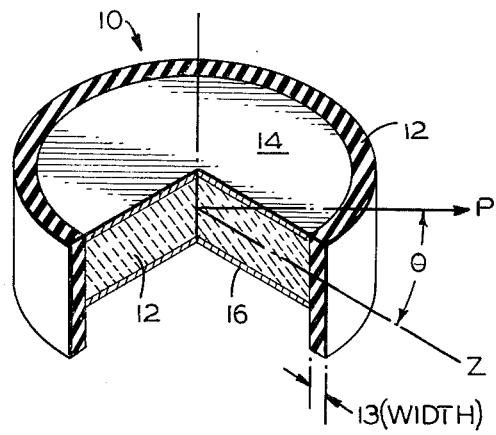
FIG. 1 is a perspective view, partly in section, of a piezoelectric ceramic resonator according to the present invention.

Referring to FIG. 1, a piezoelectric ceramic resonator 10 comprises a thin flat plate 12 of uniformly polarized piezoelectric ceramic material. From the standpoint of ease of fabrication as well as excellence of performance, it is preferable that plate 12 be in the form of a disk as shown in FIG. 1 and accordingly, it will be so described hereinafter. Other plane configurations including any polygon are also operable.

Said thin flat plate can be made of any piezoelectric ceramic such as solid solutions of lead titanate and lead zirconate in certain mole ratios and their modifications combined with certain additives. It is preferable that the thin flat plate comprise ternary solid solutions of $XPb(Mg-Nb_{2/3})O_3 \, 1 - y \, PbTiO_3 - z \, PbZrO_3$, wherein $x + y \times z = 1$, $x = 0.875 - 0.010$, $y = 0.813 - 0$ and $z = 0.95 - 0$. The aforesaid composition in which the values $x = y = 0.4375$ and $z = 0.125$ is particularly suited for said thin flat plate.

Referring once again to FIG. 1, the major, i.e. the flat plane, surfaces of the disk 12 are conductively associated with operating electrode means 14 and 16 through which electrical signal potentials are applied to the disk. The rectangular coordinates x-z are used to show the polarized direction of the disk 12. The rectangular axis X coincides with the axial direction (thickness) of the disk 12. The arrow P shows the polarization direction which is defined by an angle $\theta$ relative to the Z axis. The disk is polarized uniformly across its entire planar cross-section. The electrodes can be formed of any suitable conductive material in a conventional manner, such as electroless plating. The use of copper electroless plating makes it possible to form uniform and thin electrodes less than 1 micron thick. The contour of the edge of the disk 12 has a rubber damping ring 18 therearound. The rubber ring 18 is attached to the disk in such a way that the rubber is under tension at the contour of the edge of the disk. The tension is preferably achieved by making the ribber ring 18 in the untensional state with a smaller inside than the disk diameter, so that when it is placed around the disk it is stretched. The range of the amount of tension within which spurious unwanted vibrations will be suppressed is from 20–500 gm/cm. The tension is the force in gms. required to stretch the rubber material one cm. The tension is dependent on the amount of stretching of the rubber and the hardness thereof. Thus the desired tension is achieved by properly dimensioning the ring of a rubber of a particular hardness so that when it is stretched around the disk the desired tension is produced.

In addition there are limits within which the hardness must lie in order to be effective in suppressing the vibrations when it is under a tension within the above described range.

The hardness for the rubber damping material should be in the range of 20 to 70 on the Shore A Scale. A rubber damping material having a hardness above 70 causes a suppression of the thickness-shear mode vibrations which is not desirable. On the other hand a rubber damping material with a hardness lower than 20 does not serve to suppress the unwanted resonances of vibrations mentioned above. In addition, the vibration suppressing effect of the rubber material depends on the operating frequencies. Below frequencies of one megacycle per second, the aforesaid suppressing effect cannot be produced. In view of the effectiveness of the rubber materials on the frequency, the critical upper limit of thickness of the ceramic disk is 1.5mm, if a conventional piezoelectric ceramic material is used for the resonators.

Operable rubber materials are natural rubbers, synthetic rubbers and elastomers well known in the prior art. The width 13 of said rubber ring is related to the hardness of the rubber material and is required to be at least 0.5mm for achieving the novel damping effect. It is not necessary that the rubber ring have a circular outside shape, and any shape is operable, when the minimum width 13 is larger than 0.5mm. The novel vibration damping effect can be achieved by employing commercially available "butyl rubber" having a hardness of 35 on the Shore A Scale. There may be available various other rubber materials disclosed in the prior art literature such as the magazine entitled "Kogyo Zairyo" (Industrial Materials) Vol. 13, No. 5, 1965, published by Nikkan Kogyo Shinbunsha in Japan.

According to the present invention, the piezoelectric ceramic resonator 10 vibrates in the thickness-shear mode. The fundamental resonant frequency of the thickness-shear mode is given approximately by the equation $$f_o = \frac{\pi}{T} \sqrt{\frac{\mu}{\rho}} \quad (1)$$

where
  $f_o$: the fundamental resonant frequency of the thickness-shear mode,
  $T$: the thickness dimension of the piezoelectric ceramic plate,
  $\mu$: the shear modulus of the piezoelectric ceramic material,
  $\rho$: the density of the piezoelectric ceramic material, and
  $\pi$: the ratio of the circumference of a circle to its diameter.

As a practical matter, it may be supposed that changes slightly as a function of the polarization angle $\theta$.

According to equation (1), it is possible to control the thickness dimension T so as to produce a predetermined frequency.

The anti-resonant frequency of the resonator is given by the equation $$f_\infty = f_o \left(1 + \frac{1}{P}\right)^{\frac{1}{2}} \quad (2)$$

where
  $f_o$: the fundamental resonant frequency of the thickness-shear mode,
  $f_\infty$: the anti-resonant frequency of the thickness-shear mode, and
  $P$: the capacitance ratio of the piezoelectric ceramic resonator.

The value of the capacitance ratio $p$ is a function of the polarization angle $\theta$.

The electric capacitance of the resonator is given by the equation $$C_o = \epsilon (S/T) \quad (3)$$

where
  $C_o$: the electric capacitance between the electrodes of the piezoelectric ceramic resonator,
  $\epsilon$: the dielectric constant of the piezoelectric ceramic material,
  $S$: the cross-sectional area of the contour of the piezoelectric ceramic resonator, and
  $T$: the thickness dimension of the piezoelectric ceramic plate.

Using the equation (3), the shape and size of the contour and hence the dimension S, can be designed for a desired electric impedance.

As a practical matter, many unwanted resonant vibrations are excited piezoelectrically near the frequencies of $f_o$ and $f_\infty$ depending upon the boundary conditions at the edge of the body.

The unwanted resonant vibrations can be suppressed by said rubber damping means 18 in FIG. 1 in accordance with the invention. The exact analysis of the vibration suppression mechanism is still difficult. A possible explanation is that the unwanted vibrations caused by the boundary conditions have a strong vibration energy near the edge of the piezoelectric ceramic disk. The rubber material has a superior characteristic for suppressing mechanical vibrations as is well-known in the art. Therefore, the rubber material under tension around the edge of the disk effectively suppresses the unwanted resonance of vibrations. On the other hand, the vibration energy of the thickness-shear mode is concentrated in the central part of the disk. Therefore, the vibration characteristics of the thickness-shear mode are only slightly affected by the rubber material. As a practical matter, the suppression effect of the rubber material is completely negligible with respect to the thickness-shear mode.

Figure 2:
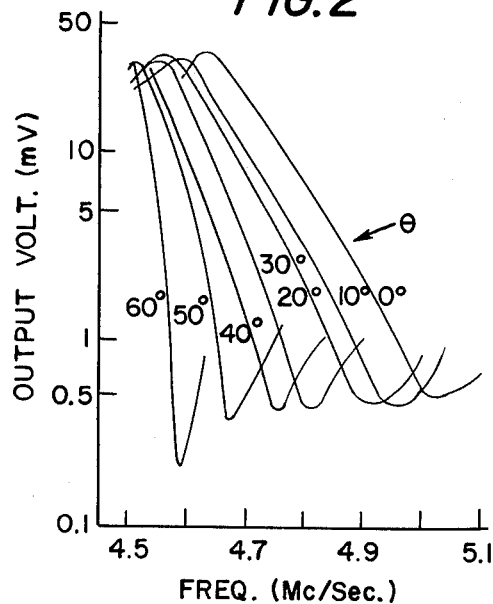
FIG. 2 is a graphic representation of the response curves of the piezoelectric resonators of the present invention.
Figure 3:
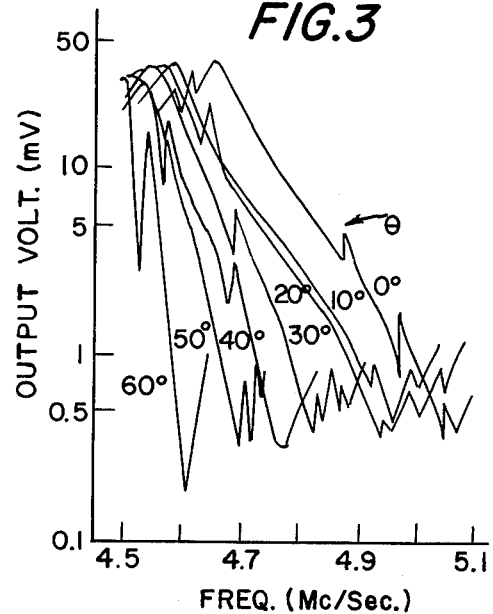
FIG. 3 is a graphic representation of the response curves of resonators without vibration damping means.

Reference is now made to FIG. 2 and FIG. 3 for illustrating piezoelectric response curves of resonators measured by a transmission circuit method as disclosed in Proc. IRE, Vol. 45, pp. 353-358 March, 1958. FIG. 2 shows piezoelectric response curves of the resonators having vibration damping means in accordance with the present invention, as a function of the polarization angle $\theta$. The measurements are carried out in a frequency range near the resonant frequency of the thickness-shear mode. The each frequency of maximum output voltage in FIG. 2 corresponds to the resonant frequency predetermined in the equation (1) and each frequency of minimum output voltage corresponds to the anti-resonant frequency determined by the equation (2). As the value of the polarization angle $\theta$ becomes large, the frequency band width ($f_\infty - f_o$) becomes narrow as shown in FIG. 2.

FIG. 3 shows piezoelectric response curves of resonators having the same ceramic disks as those in FIG. 2 but having no vibration damping means. Therefore, the difference between the piezoelectric response curves in FIG. 2 and those in FIG. 3 is attributable to whether the resonators are provided with the rubber damping means or not. It will be seen in FIG. 3 that many large and small ripples appear in the frequency range from the resonance to the anti-resonance frequency. These ripples cause distortions in an output signal of an electrical circuit.

Comparing the piezoelectric response curves in FIG. 2 with those in FIG. 3, it is apparent that the rubber damping material serves to suppress completely the unwanted resonances of vibrations in the frequency range from the resonance to the anti-resonant frequency without affecting the fundamental thickness-shear mode response as mentioned above.

The piezoelectric ceramic disks used in the resonators for producing the curves shown in FIG. 2 and FIG. 3 were about 2.36mm in diameter and 0.25mm thick. The rubber damping material used in the resonators for producing the curves shown in FIG. 2 was a butyl rubber ring having about 2.0mm inner diameter and 4.0mm outer diameter in a free state before being attached to the ceramic disk. After attachment, the rubber was stretched to the desired tension within the range set forth above. The hardness of the butyl rubber was 35 on the Shore A Scale.

Another important aspect of the configuration of the resonator of the present invention is the ratio of the dimensions of the contour to the thickness dimension of the piezoelectric ceramic plate. In case of the piezoelectric ceramic disk plate of FIG. 1, the ratio of the diameter to the thickness should be in the range from 6:1 to 20:1.

Where the ratio is lower than 6:1, the piezoelectric response of the fundamental thickness-shear mode is so strongly affected by the boundary conditions at the edge of the disc that the rubber damping material may cause a strong damping of the fundamental thickness-shear mode of vibration. Where the ratio is higher than 20:1, strong inharmonics in the thickness-shear mode of vibrations will be easily excited piezoelectrically in the frequency range from the resonance to the anti-resonant frequency. These inharmonics are too strong to be suppressed by said rubber damping means.

The polarization angle $\theta$ also has an important role in the present invention. It is possible to change the angle $\theta$ from $\theta = 0$ to $\theta = 90°$. Practically the piezoelectric response of the fundamental thickness-shear mode will become negligible just above the point where the angle $\theta = 60°$.

The piezoelectric ceramic resonator explained hereinabove can be prepared by the following steps. A piezoelectric ceramic body is formed by well-known ceramic techniques into a shape having parallel major surfaces. A conductive material such as silver is applied to the major surfaces in a conventional manner so as to form electrodes for polarization. The polarization is performed by applying DC high voltages between the electrodes in a conventional way. The piezoelectric body is polarized perpendicularly to the major surfaces, and then is cut into a plate by a cutting tool, such as diamond cutter, in such a way that the plate has a thickness in accordance with the equation (1) and the polarization angle $\theta$ is a given value as mentioned above. The plate surfaces then are coated with a copper plate by means of copper electroless plating. Thereafter the specimen is immersed in an aqueous solution of silver cyanide and the copper surface is replaced with silver. This process is well known as immersion plating or galvanic displacement plating. In immersion plating, the use of an active metal solution to provide the needed reducing potential is eliminated, and instead, the work itself goes into solution. Naturally, immersion plating is limited to system in which the metal to be placed is more noble than the substrate. The dimensions of the contour of the silver coated plate are adjusted by an ultrasonic machining technique so as to have a contour sectional area S in accordance with the equation (3). The edge of the dimensionally adjusted plate is provided with a rubber damper ring which has an inner diameter smaller than the diameter of the resultant disk. It is important that the polarized ceramic body be kept below 60° C during the manufacturing steps in order to prevent depolarization of the polarized ceramic body.

Figure 4:
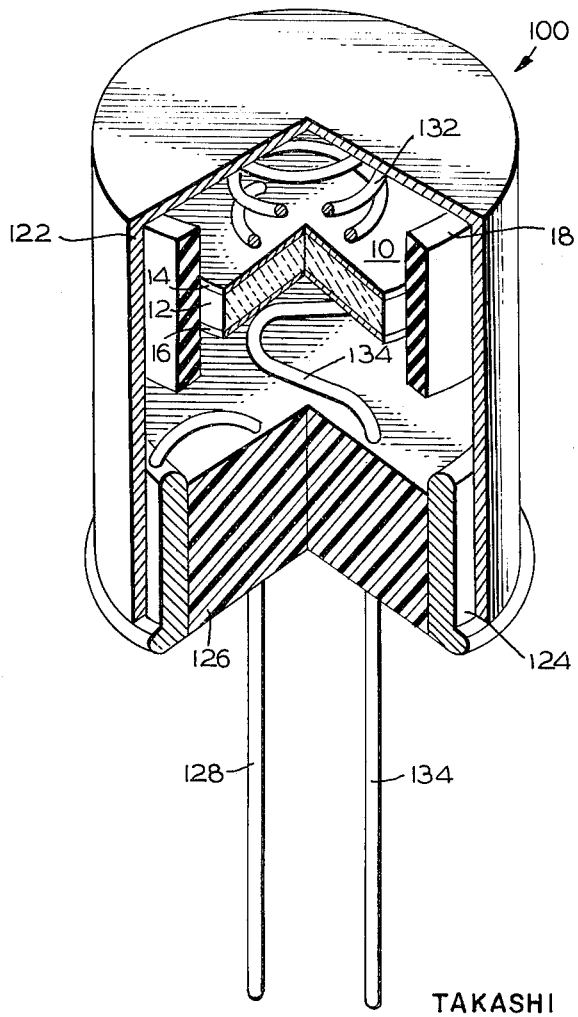
FIG. 4 is a sectional view of a resonator component employing the piezoelectric ceramic resonators of the present invention.

Referring to FIG. 4, wherein similar reference characters designate parts similar to those in FIG. 1, and reference character 100 designates, as a whole, a resonator component comprising a ceramic resonator 10 the same as that of FIG. 1 in accordance with the invention. Said resonator element 10 having rubber ring 18 is mounted in a capsule comprising a metal cap 122 and a base 124 between which cap and base the element 10 is supported by metal coil springs 132 and 134. Said base 124 is filled with an insulating material 126 such as glass or resin in which a lead wire 128 and lead wire 134 are fixed. Said lead wire 128 is conductively connected to said base 124. The electrode 14 on one surface of piezoelectric ceramics 12 is connected electrically to said lead wire 128 through said coil spring 132, said cap 122 and said base 124. The electrode 16 is connected electrically to said lead wire 134 through the coil spring made from one end of said lead wire 134.

At the operating frequency, the electrode surfaces of the resonator 10 do not have any nodal points of nodal surfaces. Therefore, the piezoelectric response will vary greatly if the electric lead 128 and 134 are connected directly to the electrodes of the resonator by a conventional method such as soldering.

Figure 5:
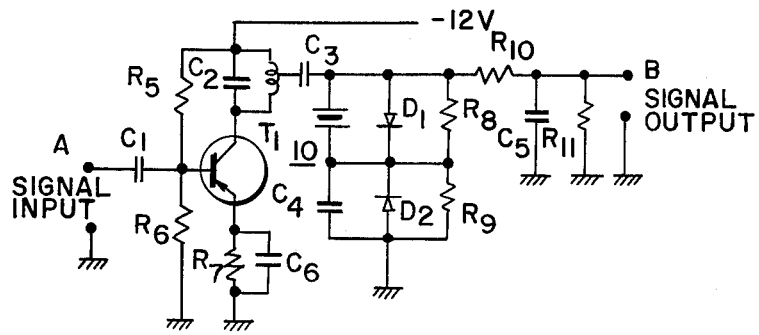
FIG. 5 is a schematic diagram of an FM discriminator circuit employing a resonator according to the present invention.
Figure 6:
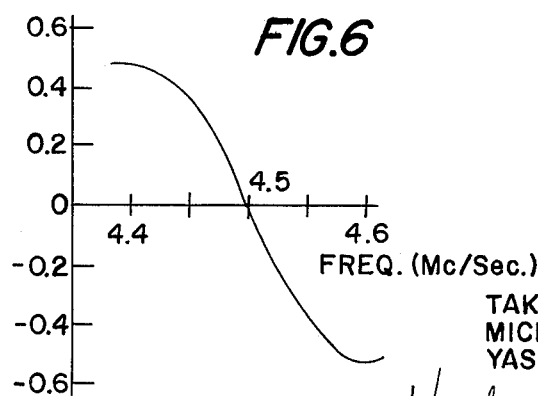
FIG. 6 is a graphic representation of output voltages vs. frequency of the discriminator shown in FIG. 5.

Reference is now made to FIG. 5 and FIG. 6 illustrating one of the important applications of the present invention to an FM sound discriminator for a television receiver set. In FIG. 5 the conventional notations C, R, D and T designate a capacitor, resistor, diode and transistor, respectively. A commercially available television receiver is provided with an FM sound discriminator stage inserted between an intermediate frequency sound amplifier and an audio amplifier. In the circuit of FIG. 5 the frequency modulated sound signal is applied to the input terminal A, amplified at transistor $T_1$ and demodulated in the circuit which is a combination of the ceramic resonator 10 and diode D. The demodulated signal is fed to an audio amplifier through the output terminal B. In FIG. 6, the typical detected output characteristics of the sound discriminator disclosed in FIG. 5 are shown. By using the ceramic resonator of the present invention, the sound discriminator circuit can be made extremely simple.

While there have been described what are at present considered to be the preferred embodiments of this invention, it will be obvious to those skilled in the art that various changes and modifications can be made therein without departing from the invention as set forth in the appended claims.

What is claimed is:
1. In a piezoelectric ceramic resonator including a thin flat disk of piezoelectric ceramic material which has parallel major planar surfaces and is polarized in one direction, the thickness dimension of said disk being such as to impart thereto a resonance of vibration in a thickness-shear mode at a selected frequency higher than 1MHz, operating electrodes applied to said major surfaces, and vibration damping means attached to the contour of the edge of said flat disk;

the improvement wherein the direction of polarization is at an angle of from 0° to 60° with respect to said major surfaces of the disk, and disk having a ratio of the diameter to the thickness of from 6:1 to 20:1, and said damping means is a rubber ring having a hardness from 20 to 70 on the Shore A Scale and is attached to said edge of the disk under a tension of 20–500 gr/cm.

2. A piezoelectric ceramic resonator as claimed in claim 1 wherein said thin flat disk has a thickness less than 1.5 mm.

3. A pizoelectric ceramic resonator as claimed in claim 1 wherein said piezoelectric ceramic material comprises ternary solid solutions of $x$ Pb(Mg$_{1/3}$Nb$_{2/3}$) $-$ $y$ PbTiO$_3$ $-$ $z$ PbZrO$_3$ where $x + y + z = 1$, $x$ has a value of from 0.875 to 0.010, $y$ has a value of from 0.813 to 0, and $z$ has a value of from 0.95 to 0.

4. A piezoelectric ceramic resonator as claimed in claim 1 wherein said rubber ring has a width of more than 0.5 mm.

* * * * *